US006367147B2

(12) United States Patent
Giere et al.

(10) Patent No.: US 6,367,147 B2

(45) Date of Patent: Apr. 9, 2002

(54) SEGMENTED RESISTOR INKJET DROP GENERATOR WITH CURRENT CROWDING REDUCTION

(75) Inventors: Matthew Giere; Noah C. Lassar, both of San Diego; Satya Prakash, Poway, all of CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/802,534

(22) Filed: Mar. 5, 2001

Related U.S. Application Data

(62) Division of application No. 09/386,033, filed on Aug. 30, 1999.

(51) Int. Cl.[7] .................................................. H05K 3/20

(52) U.S. Cl. ............................................ 29/611; 29/831

(58) Field of Search ........................ 347/54, 56, 61–63, 347/65; 29/611, 621, 830, 831

(56) References Cited

U.S. PATENT DOCUMENTS

| | | | | |
|---|---|---|---|---|
| 4,339,762 A | | 7/1982 | Shirato et al. | 347/62 |
| 4,458,256 A | | 7/1984 | Shirato et al. | 347/58 |
| 4,514,741 A | | 4/1985 | Meyer | 347/62 |
| 4,870,433 A | * | 9/1989 | Campbell et al. | 347/62 |
| 4,935,752 A | | 6/1990 | Hawkins | 347/62 |
| 5,212,503 A | | 5/1993 | Saito et al. | 347/59 |
| 5,455,613 A | | 10/1995 | Canfield et al. | 347/65 |
| 5,475,405 A | | 12/1995 | Widder et al. | 347/14 |
| 5,808,640 A | | 9/1998 | Bhaskar et al. | 347/58 |
| 5,835,112 A | | 11/1998 | Whitlock et al. | 347/50 |
| 6,123,419 A | | 9/2000 | Cleland | 347/62 |

FOREIGN PATENT DOCUMENTS

| | | | | |
|---|---|---|---|---|
| EP | 0-124312 A2 | * | 12/1983 | B41J/3/04 |
| EP | 0124312 A2 | | 11/1984 | B41J/3/04 |
| EP | 0352978 A2 | | 6/1990 | B41J/2/065 |
| EP | 0638424 Aw | | 2/1995 | B41J/2/16 |
| JP | 58211470 | | 12/1983 | B41J/3/20 |
| JP | 61100467 | | 5/1986 | B41J/3/04 |

* cited by examiner

*Primary Examiner*—John Barlow
*Assistant Examiner*—Juanita Stephens
(74) *Attorney, Agent, or Firm*—Raymond A. Jenski

(57) ABSTRACT

In order to overcome inefficient power dissipation in parasitic resistances and to provide economies in the power supply, a higher resistance value heater resistor is employed in a thermal inkjet printhead. Higher current densities in a high resistance segmented heater resistor are reduced by employing a shorting bar divided by a current balancing resistor.

11 Claims, 8 Drawing Sheets

SEGMENTED RESISTOR INKJET DROP GENERATOR WITH CURRENT CROWDING REDUCTION

CROSS REFERENCE TO RELATED APPLICATIONS

This is a divisional of copending application Ser. No. 09/386,033 filed on Aug. 30, 1999.

BACKGROUND OF THE INVENTION

The present invention relates generally to inkjet printing devices, and more particularly to an inkjet printhead drop generator that utilizes a high resistance heater resistor structure with current crowding reduction.

The art of inkjet printing technology is relatively well developed. Commercial products such as computer printers, graphics plotters, copiers, and facsimile machines successfully employ inkjet technology for producing hard copy printed output. The basics of the technology has been disclosed, for example, in various articles in the Hewlett-Packard Journal, Vol. 36, No. 5 (May 1985), Vol. 39, No. 4 (August 1988), Vol. 39, No. 5 (October 1988), Vol. 43, No. 4 (August 1992), Vol. 43, No. 6 (December 1992) and Vol. 45, No. 1 (February 1994) editions. Inkjet devices have also been described by W. J. Lloyd and H. T. Taub in Output Hardcopy Devices (R. C. Durbeck and S. Sherr, ed., Academic Press, San Diego, 1988, chapter 13).

A thermal inkjet printer for inkjet printing typically includes one or more translationally reciprocating print cartridges in which small drops of ink are formed and ejected by a drop generator towards a medium upon which it is desired to place alphanumeric characters, graphics, or images. Such cartridges typically include a printhead having an orifice member or plate that has a plurality of small nozzles through which the ink drops are ejected. Beneath the nozzles are ink firing chambers, enclosures in which ink resides prior to ejection by an ink ejector through a nozzle. Ink is supplied to the ink firing chambers through ink channels that are in fluid communication with an ink supply, which may be contained in a reservoir portion of the print cartridge or in a separate ink container spaced apart from the printhead.

Ejection of an ink drop through a nozzle employed in a thermal inkjet printer is accomplished by quickly heating the volume of ink residing within the ink firing chamber with a selectively energizing electrical pulse to a heater resistor positioned in the ink firing chamber. At the commencement of the heat energy output from the heater resistor, an ink vapor bubble nucleates at sites on the surface of the heater resistor or its protective layers. The rapid expansion of the ink vapor bubble forces the liquid ink through the nozzle. Once the electrical pulse ends and ink is ejected, the ink firing chamber refills with ink from the ink channel and ink supply.

The electrical energy required to eject an ink drop of a given volume is referred to as "turn-on energy". The turn-on energy is a sufficient amount of energy to overcome thermal and mechanical inefficiencies of the ejection process and to form a vapor bubble having sufficient size to eject a predetermined amount of ink through the printhead nozzle. Following removal of electrical power from the heater resistor, the vapor bubble collapses in the firing chamber in a small but violent way. Components within the printhead in the vicinity of the vapor bubble collapse are susceptible to fluid mechanical stresses (cavitation) as the vapor bubble collapses, allowing ink to crash into the ink firing chamber components. The heater resistor is particularly susceptible to damage from cavitation. A protective layer, comprised of one or more sublayers, is typically disposed over the resistor and adjacent structures to protect the resistor from cavitation and from chemical attack by the ink. The protective sublayer in contact with the ink is a thin hard cavitation layer that provides protection from the cavitation wear of the collapsing ink. Another sublayer, a passivation layer, is typically placed between the cavitation layer and the heater resistor and associated structures to provide protection from chemical attack. Thermal inkjet ink is chemically reactive, and prolonged exposure of the heater resistor and its electrical interconnections to the ink will result in a chemical attack upon the heater resistor and electrical conductors. The protection sublayers, however, tend to increase the turn-on energy required for ejecting drops of a given size. Additional efforts to protect the heater resistor from cavitation and attack include separating the heater resistor into several parts and leaving a center zone (upon which a majority of the cavitation energy concentrates in a top firing thermal inkjet firing chamber) free of resistive material.

The heater resistor of a conventional inkjet printhead utilizes a thin film resistive material disposed on an oxide layer of a semiconductor substrate. Electrical conductors are patterned onto the oxide layer and provide an electrical path to and from each thin film heater resistor. Since the number of electrical conductors can become large when a large number of heater resistors are employed in a high density (high DPI—dots per inch) printhead, various multiplexing techniques have been introduced to reduce the number of conductors needed to connect the heater resistors to circuitry disposed in the printer. See, for example, U.S. Pat. No. 5,541,629 "Printhead with Reduced Interconnections to a Printer" and U.S. Pat. No. 5,134,425, "Ohmic Heating Matrix". Each electrical conductor, despite its good conductivity, imparts an undesirable amount of resistance in the path of the heater resistor. This undesirable parasitic resistance dissipates a portion of the electrical power which otherwise would be available to the heater resistor. If the heater resistance is low, the magnitude of the current drawn to nucleate the ink vapor bubble will be relatively large and the amount of energy wasted in the parasitic resistance of the electrical conductors will be significant. That is, if the ratio of resistances between that of the heater resistor and the parasitic resistance of the electrical conductors (and other components) is too small, the efficiency of the printhead suffers with the wasted energy.

The ability of a material to resist the flow of electricity is a property called resistively. Resistively is a function of the material used to make the resistor and does not depend upon the geometry of the resistor of the thickness of the resistive film used to form the resistor. Resistively is related to resistance by:

$$R=\rho L/A$$

where R=resistance (Ohms); ρ=resistively (Ohm-cm); L=length of resistor; and A=cross sectional area of resistor. For thin film resistors typically used in thermal inkjet printing applications, a property commonly known as sheet resistance ($R_{sheet}$) is commonly used in analysis and design of heater resistors. Sheet resistance is the resistively divided by the thickness of the film resistor, and resistance is related to sheet resistance by:

$$R=R_{sheet}(L/W)$$

where L=length of the resistive material and W=width of the resistive material. Thus, resistance of a thin film resistor of a given material and of a fixed film thickness is a simple calculation of length and width for rectangular and square geometries.

Most of the thermal inkjet printers available today use heater resistors that are roughly of a square shape and have a resistance of 35 to 40 Ohms. If it were possible to use resistors with higher values of resistance, the energy needed to nucleate an ink vapor bubble would be transmitted to the thin film heater resistor at a higher voltage and lower current. The energy wasted in the parasitic resistances would be reduced and the power supply that provides the power to the heater resistors could be made smaller and less expensive. Realization of the higher values of resistance, however, may increase the current density despite the overall current reduction. High current density can reduce the life of electronic circuits by creating localized elevated temperatures and by generating high electric field strengths that induce electromigration in materials. Moreover, in applications where the current is switched on and off, such as in thermal inkjet heater resistors, extreme thermal cycling produces expansion and contraction, which results in fatigue failures.

SUMMARY OF THE INVENTION

A segmented heater resistor for an inkjet printer includes a first heater resistor segment and a second heater resistor segment. A coupling device provides a serial coupling between the first and second resistor segments. A current control device provides reduced current crowding in the coupling device.

DETAILED DESCRIPTION OF A PREFERRED EMBODIMENT

There are three main techniques for obtaining a higher resistance heater resistor for use in a thermal inkjet printer application. First, a thinner resistance layer can be deposited on the substrate oxide. The downside of this approach is that as the films become thinner, they become susceptible to surface defects and, the thinner the film, the more difficult it becomes to control the film thickness. Second, a different material having a higher innate resistively than the well understood tantalum-aluminum film could be used. The extreme environmental conditions experienced by the heater resistor as well as the need for an inexpensive, low defect, thin film process reduces the short term desirability of this approach. Third, new configurations of thin film resistor geometries can result in higher resistance heater resistors. It is from this third technique that the present invention derives.

Figure 1A:
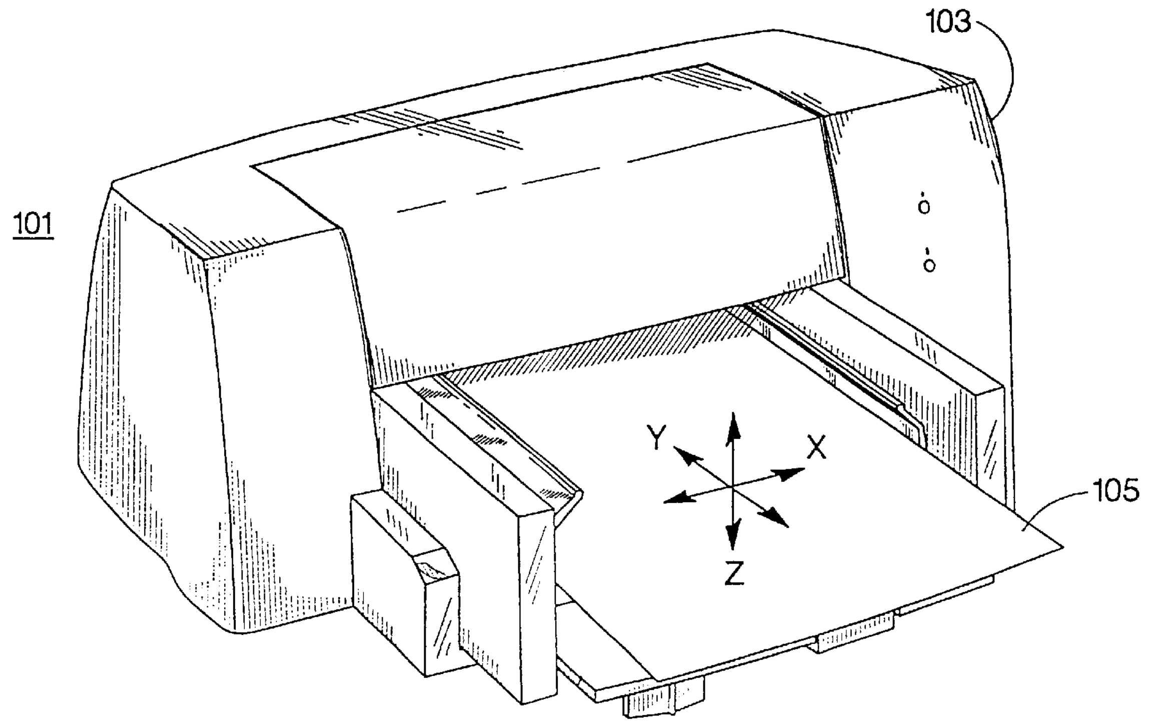
FIG. 1A is an isometric illustration of an exemplary printing apparatus which may employ the present invention.
Figure 1B:
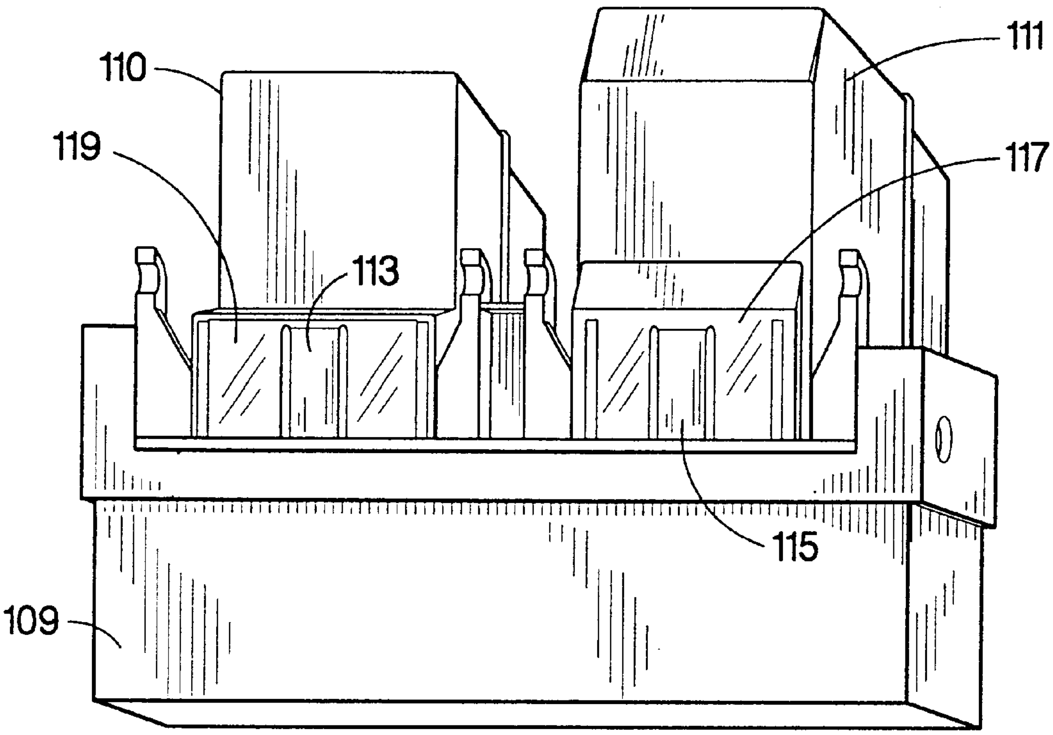
FIG. 1B is an isometric drawing of a print cartridge apparatus which may be employed in the printing apparatus of FIG. 1A.

An exemplary inkjet printing apparatus, a printer 101, that may employ the present invention is shown in outline form in the isometric drawing of FIG. 1A. Printing devices such as graphics plotters, copiers, and facsimile machines may also profitably employ the present invention. A printer housing 103 contains a printing platen to which an input print medium 105, such as paper, is transported by mechanisms that are known in the art. A carriage within the printer 101 holds one or a set of individual print cartridges capable of ejecting ink drops of black or color ink. Alternative embodiments can include a semi-permanent printhead mechanism that is sporadically replenished from one or more fluidically-coupled, off-axis, ink reservoirs, or a single print cartridge having two or more colors of ink available within the print cartridge and ink ejecting nozzles designated for each color, or a single color print cartridge or print mechanism; the present invention is applicable to a printhead employed by at least these alternatives. A carriage 109, which may be employed in the present invention and mounts two print cartridges 110 and 111, is illustrated in FIG. 1B. The carriage 109 is typically mounted on a slide bar or similar mechanism within the printer and physically propelled along the slide bar to allow the carriage 109 to be translationally reciprocated or scanned back and forth across the print medium 105. The scan axis, X, is indicated by an arrow in FIG. 1A. As the carriage 109 scans, ink drops are selectively ejected from the printheads of the set of print cartridges 110 and 111 onto the medium 105 in predetermined print swath patterns, forming images or alphanumeric characters using dot matrix manipulation. Generally, the dot matrix manipulation is determined by a user's computer (not shown) and instructions are transmitted to a microprocessor-based, electronic controller (not shown) within the printer 101. Other techniques employ a rasterization of the data in a user's computer prior to the rasterized data being sent, along with printer control commands, to the printer. This operation is under control of printer driver software resident in the user's computer. The printer interprets the commands and rasterized data to determine which drop generators to fire. The ink drop trajectory axis, Z, is indicated by the arrow. When a swath of print has been completed, the medium 105 is moved an appropriate distance along the print media axis, Y, indicated by the arrow in preparation for the printing of the next swath. This invention is also applicable to inkjet printers employing alternative means of imparting relative motion between printhead and media, such as those that have fixed printheads (such as page wide arrays) and move the media in one or more directions, those that have fixed media and move the printhead in one or more directions (such as flatbed plotters). In addition, this invention is applicable to a variety of printing systems, including large format devices, copiers, fax machines, photo printers, and the like.

The inkjet carriage 109 and print cartridges 110, 111 are shown from the -Z direction within the printer 101 in FIG.

1B. The printheads 113, 115 of each cartridge may be observed when the carriage and print cartridges are viewed from this direction. In a preferred embodiment, ink is stored in the body portion of each printhead 110,115 and routed through internal passageways to the respective printhead. In an embodiment of the present invention which is adapted for multi-color printing, three groupings of orifices, one for each color (cyan, magenta, and yellow), is arranged on the foraminous orifice plate surface of the printhead 115. Ink is selectively expelled for each color under control of commands from the printer that are communicated to the printhead 115 through electrical connections and associated conductive traces (not shown) on a flexible polymer tape 117. In the preferred embodiment, the tape 117 is typically bent around an edge of the print cartridge as shown and secured. In a similar manner, a single color ink, black, is stored in the ink-containing portion of cartridge 110 and routed to a single grouping of orifices in printhead 113. Control signals are coupled to the printhead from the printer on conductive traces disposed on a polymer tape 119.

Figure 2:
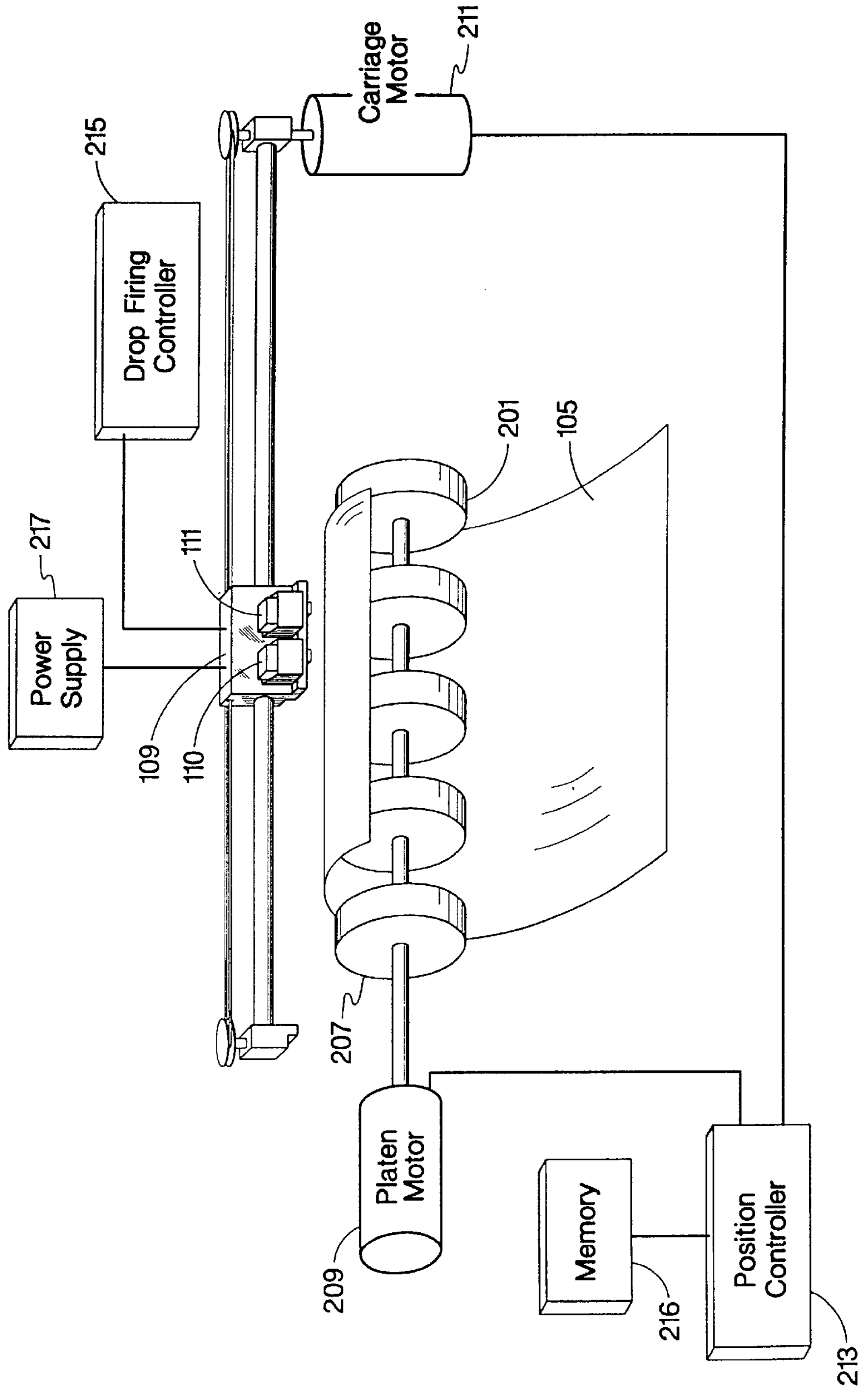
FIG. 2 is a schematic representation of the functional elements of FIG. 1A.

As can be appreciated from FIG. 2, a single medium sheet is advanced from an input tray into a printer print area beneath the printheads by a medium advancing mechanism including a roller 207, a platen motor 209, and traction devices (not shown). In a preferred embodiment, the inkjet print cartridges 110, 111 are incrementally drawn across the medium 105 on the platen by a carriage motor 211 in the ±X direction, perpendicular to the Y direction of entry of the medium. The platen motor 209 and the carriage motor 211 are typically under the control of a media and cartridge position controller 213. An example of such positioning and control apparatus may be found described in U.S. Pat. No. 5,070,410 "Apparatus and Method Using a Combined Read/Write Head for Processing and Storing Read Signals and for Providing Firing Signals to Thermally Actuated Ink Ejection Elements". Thus, the medium 105 is positioned in a location so that the print cartridges 110 and 111 may eject drops of ink to place dots on the medium as required by the data that is input to a drop firing controller 215 and power supply 217 of the printer. These dots of ink are formed from the ink drops expelled from selected orifices in the printhead in a band parallel to the scan direction as the print cartridges 110 and 111 are translated across the medium by the carriage motor 211. When the print cartridges 110 and 111 reach the end of their travel at an end of a print swath on the medium 105, the medium is conventionally incrementally advanced by the position controller 213 and the platen motor 209. Once the print cartridges have reached the end of their traverse in the X direction on the slide bar, they are either returned back along the support mechanism while continuing to print or returned without printing. The medium may be advanced by an incremental amount equivalent to the width of the ink ejecting portion of the printhead or some fraction thereof related to the spacing between the nozzles. Control of the medium, positioning of the print cartridge, and selection of the correct ink ejectors for creation of an ink image or character is determined by the position controller 213. The controller may be implemented in a conventional electronic hardware configuration and provided operating instructions from conventional memory 216. Once printing of the medium is complete, the medium is ejected into an output tray of the printer for user removal.

Figure 3:
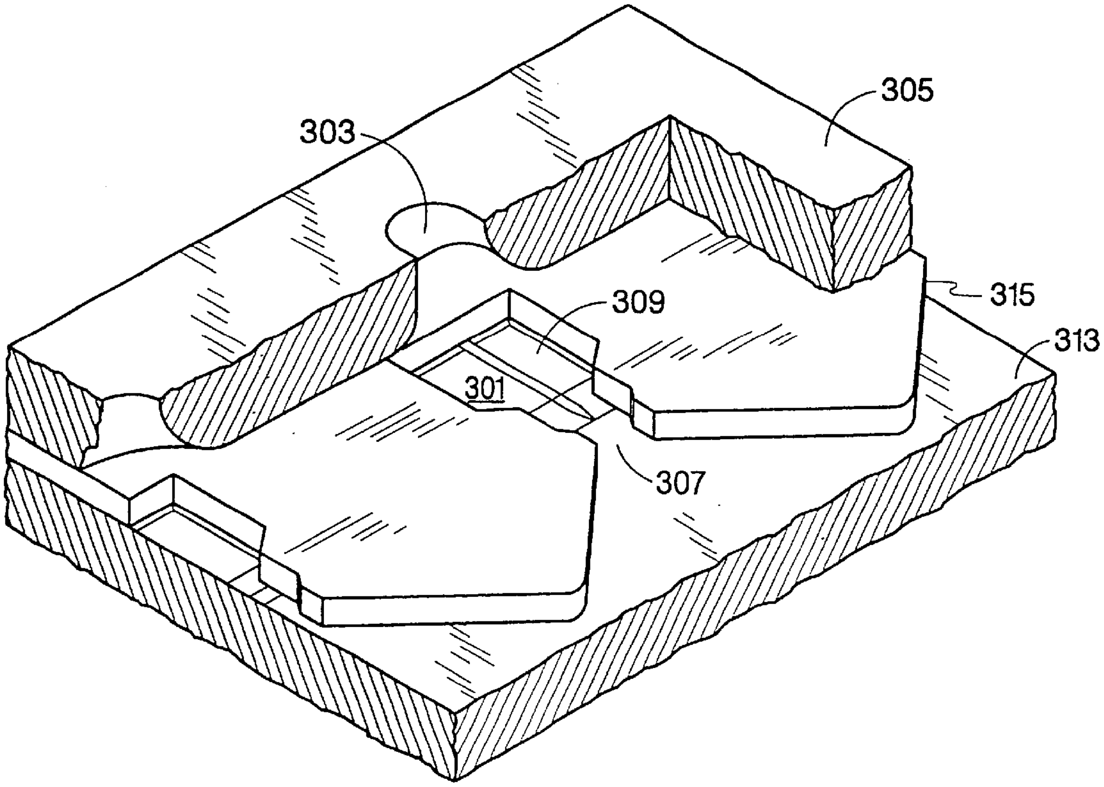
FIG. 3 is a magnified isometric cross section of a drop generator which may be employed in the printhead of the print cartridges of FIG. 1B.

A single example of an ink drop generator found within a printhead is illustrated in the magnified isometric cross section of FIG. 3. As depicted, the drop generator comprises a nozzle, a firing chamber, and an ink ejector. Alternative embodiments of a drop generator employ more than one coordinated nozzle, firing chamber, and/or ink ejectors. The drop generator is fluidically coupled to a source of ink.

In FIG. 3, the preferred embodiment of an ink firing chamber 301 is shown in correspondence with a nozzle 303 and a segmented heater resistor 309. Many independent nozzles are typically arranged in a predetermined pattern on the orifice plate so that the ink which is expelled from selected nozzles creates a defined character or image of print on the medium. Generally, the medium is maintained in a position which is parallel to the external surface of the orifice plate. The heater resistors are selected for activation by the microprocessor and associated circuitry in the printer in a pattern related to the data presented to the printer by the computer so that ink which is expelled from selected nozzles creates a defined character or image of print on the medium. Ink is supplied to the firing chamber 301 via opening 307 to replenish ink that has been expelled from orifice 303 when ink has been vaporized by heat energy released by the segmented heater resistor 309. The ink firing chamber is bounded by walls created by an orifice plate 305, a layered semiconductor substrate 313, and firing chamber wall 315. In a preferred embodiment, fluid ink stored in a reservoir of the cartridge housing 212 flows by capillary force to fill the firing chamber 301.

Once the ink is in the firing chamber 301 it remains there until it is rapidly vaporized by the heat energy created by the electrically energized segmented heater resistor 309 disposed on the oxidized surface of substrate 313. The substrate is typically a semiconductor such as silicon. The silicon is treated using either thermal oxidation or vapor deposition techniques to form a thin layer of silicon dioxide thereon. The segmented heater resistor 309 is then created by depositing a patterned film of resistive material on the silicon dioxide. Preferably, the film is tantalum aluminum, TaAl, which is a well known resistive heater material in the art of thermal inkjet printhead construction. Next, a thin layer of aluminum is deposited to provide the electrical conductors.

Figure 4:
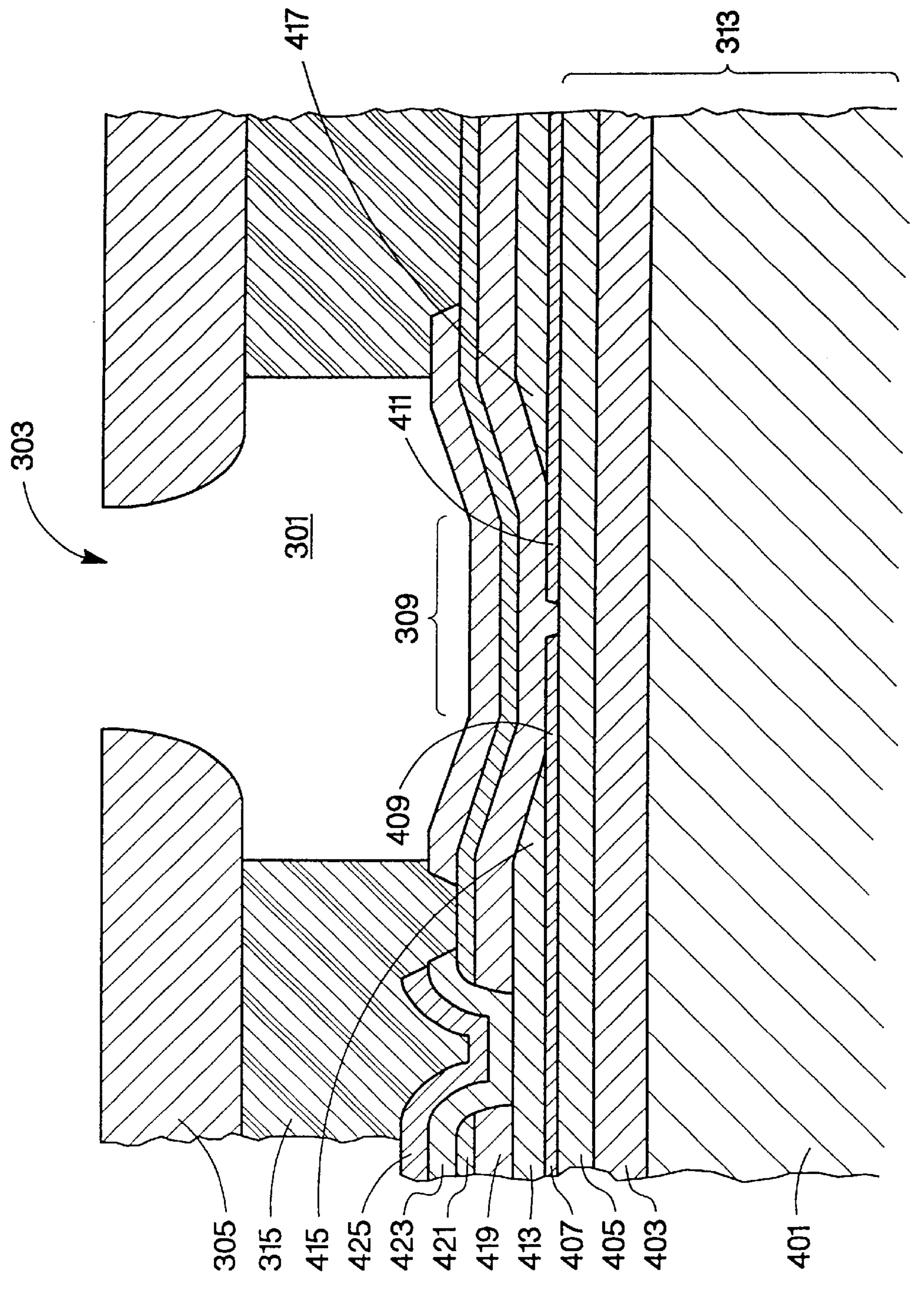
FIG. 4 is a cross sectional elevation view of the drop generator of FIG. 3.

In FIG. 4, a cross section of the firing chamber 301 and the associated structures are shown. The substrate 313 comprises, in the preferred embodiment, a silicon base 401, treated using either thermal oxidation or vapor deposition techniques to form a thin layer 403 of silicon dioxide and a thin layer 405 of phospho-silicate glass (PSG) thereon. The silicon dioxide and PSG forms an electrically insulating layer approximately 17000 Angstroms thick upon which a subsequent discontinuous layer 407 of tantalum-aluminum (TaAl) of resistive material is deposited. The tantalum aluminum layer is deposited to a thickness of approximately 900 Angstroms to yield a resistively of approximately 30 Ohms per square. In a preferred embodiment, the resistive layer is conventionally deposited using a magnetron sputtering technique and then masked and etched to create discontinuous and electrically independent areas of resistive material such as areas 409 and 411. Next, a layer of aluminum-silicon-copper (AlSiCu) alloy conductor is conventionally magnetron sputter deposited to a thickness of approximately 5000 Angstroms atop the tantalum aluminum layer areas 409, 411 and etched to provide discontinuous and independent electrical conductors (such as conductors 415 and 417) and interconnect areas. To provide protection for the heater resistors, a composite layer of material is deposited over the upper surface of the conductor layer and resistor layer. A dual layer of passivating materials includes a first layer 419 of silicon nitride approximately 2500 Angstroms thick which is covered by a second layer 421 of inert silicon carbide approximately 1250 Angstroms thick. This passivation layer (419, 421) provides both good adherence to the underlying materials and good protection against ink corrosion. It also provides electrical insulation. An area over the heater resistor 309 and its associated electrical connection to electrical conductors is subsequently masked and a cavitation layer 423 of tantalum 3000 Angstroms thick is conventionally sputter deposited. A gold layer 425 may be selectively added to the cavitation layer in areas where electrical interconnection to an interconnection material is desired. An example of semiconductor processing for thermal inkjet applications may be found in U.S. Pat. No. 4,862,197, "Process for Manufacturing Thermal Inkjet Printhead and Integrated Circuit (IC) Structures Produced Thereby." An alternative thermal inkjet semiconductor process may be found in U.S. Pat. No. 5,883,650, Thin-Film Printhead Device for an Ink-Jet Printer."

In a preferred embodiment, the sides of the firing chamber 301 and the ink feed channel are defined by a polymer barrier layer 315. This barrier layer is preferably made of an organic polymer plastic that is substantially inert to the corrosive action of ink and is conventionally deposited upon substrate 313 and its various protective layers. To realize the desired structure, the barrier layer is subsequently photolithographically defined into desired shapes and then etched. Typically the barrier layer 315 has a thickness of about 15 micrometers after the printhead is assembled with the orifice plate 305.

The orifice plate 305 is secured to the substrate 313 by the barrier layer 315. In some print cartridges the orifice plate 305 is constructed of nickel with plating of gold to resist the corrosive effects of the ink. In other print cartridges, the orifice plate is formed of a polyamide material that can be made into a common electrical interconnect structure. In an alternative embodiment, the orifice plate and barrier layer is integrally formed on the substrate.

Figure 5:
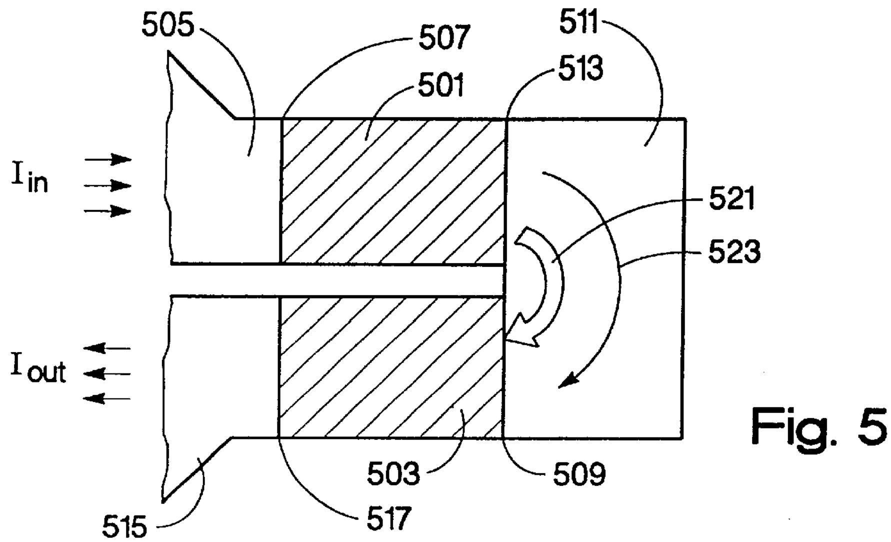
FIG. 5 is a plan view of a segmented heater employing a shorting bar.

In a preferred embodiment of the present invention, a heater resistor having a higher value of resistance is employed to overcome the problems stated above, in particular the problems of undesired energy dissipation in the parasitic resistance and of the necessity of having a high current capacity in the power supply. Here, the implementation of a higher value resistance resistor is that of revising the geometry of the heater resistor, specifically that of providing two segments having a greater length than width. Since it is preferred to have the heater resistor located in one compact spot for optimum vapor bubble nucleation in a top-shooting (ink drop ejection perpendicular to the plane of the heater resistor) printhead, the resistor segments are disposed long side to long side as shown in FIG. 5. As shown, heater resistor segment 501 is disposed with one of its long sides essentially parallel to the long side of heater resistor segment 503. Electrical current $I_{in}$ is input via conductor 505 to an input port 507 of the resistor segment 501 disposed at one of the short sides (width) edges of resistor segment 501. The electrical current, in the preferred embodiment, is coupled to the input port 509 of the resistor segment 503 disposed at one of the short side (width) edges of resistor segment 503 by coupling device that has been termed a "shorting bar" 511. The shorting bar is a portion of conductor film disposed between the output port 513 of heater resistor segment 501 and the input port 509 of heater resistor segment 503. The electrical current $I_{out}$ is returned to the power supply via conductor 515 connected to the output port 517 of heater resistor segment 503. As shown, with no additional electrical current sources or sinks, $I_{in}=I_{out}$. The output ports 513 and 517 of heater resistor segments 501 and 503, respectively, are disposed at the opposite short side (width) edges of the heater resistor segments from the input ports.

By placing the two resistor segments in a compact area, it is necessary for the electric current to change direction by way of the coupling device or shorting bar portion 511. Because the path of the electrons comprising the electric current is shorter between the two proximate corners of the heater resistor segments (causing the parasitic resistance of the shorter path to be less than the longer path), more of the electric current flows in this shorter path, illustrated by arrow 521 in FIG. 5, than any other path, illustrated by arrow 523. This concentration of current has been termed "current crowding". High current density produced by such current crowding will reduce the life of electronic circuits because it creates locally elevated temperatures and creates high electric field strengths that induce electromigration. In applications where the electric current is cycled on and off, such as in a thermal inkjet printhead, the rapid thermal variation causes expansion and contraction of the printhead substrate and the thin film layers disposed thereon. In areas having differential thermal expansion and contraction amounts because of the differences in thermal expansion rates of different materials, such as at the junction of a heater resistor segment and the conductor shorting bar, material fatigue stresses will cause an early failure.

Figure 6B:
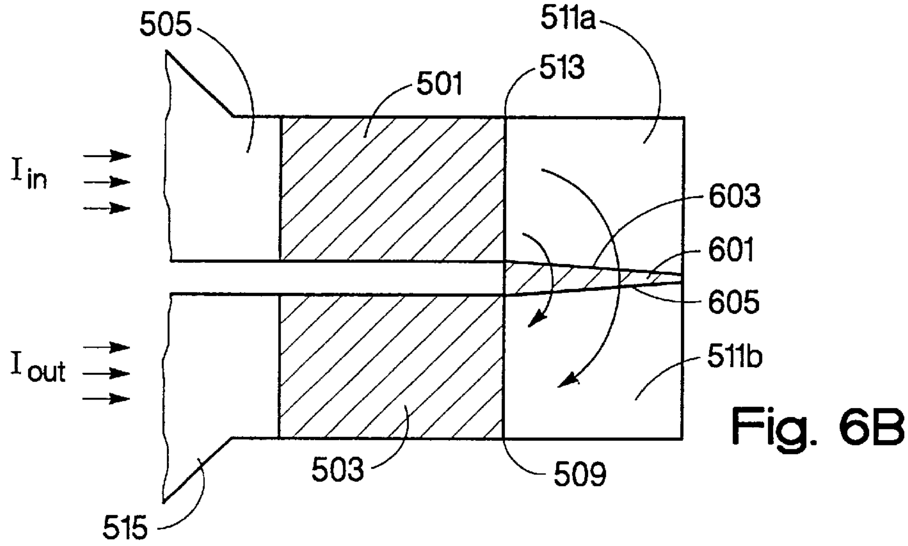
FIGS. 6A, 6B, and 6C are plan views of a segmented heater resistor employing a divided shorting bar and a current control device.
Figure 6A:
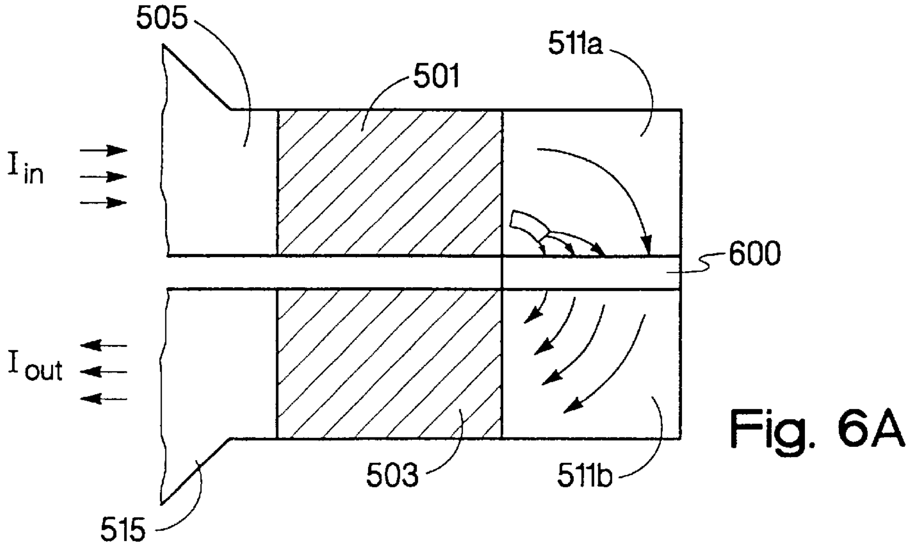

To address the current crowding problem, a feature of the present invention causes the current flow to spread more uniformly through the shorting bar. This is accomplished by enhancing the shorting bar with a current control device 600. This current control device comprises a modified and/or missing portion of the conductive film that serially connects resistor segments 501 and 503. Preferably, the control device 600 is a portion of coupling device 511 having varying degrees of sheet resistance to reduce problems with current concentrations or current crowding in coupling device 511. Preferably, the current control device 600 includes a higher sheet resistance region of coupling device 511 positioned in the shorter current path 521 region of coupling device 511. In a theoretical limit, removing a portion of the conductive sheet in the shorter current path 521 region is equivalent to an infinite sheet resistance in that region. In a preferred embodiment, the current control device 600 is realized as a current balancing element created in association with the shorting bar. As shown in FIG. 6B, a balancing resistor 601 separates the shorting bar portion into two shorting bar segments, segment 511*a* and segment 511*b*. In a preferred embodiment where the resistive material is deposited first on the oxide layer of the semiconductor substrate then overlain with an electrical conductor film, balancing resistor 601 is preferably created by etching shorting bar portion conductive film in the balancing resistor 601 area, thereby exposing the resistive material layer and creating a resistor (unshorted by the conductive layer disposed atop the resistive material layer). Alternatively the conductive film may be selectively deposited in masking and deposition steps. Although the balancing element is preferably a resistor, other elements, such as a parallel arrangement of diodes, or similar current restrictive devices may be employed in the present invention.

Balancing resistor 601, in the preferred embodiment, is created with a trapezoidal or triangular-shaped tapered geometry in which the widest (base) end is positioned in the area of the shorting bar which previously experienced current crowding. The balancing resistor is further created with its narrowest (apex) end furthest from the area furthest from the area of current crowding. This tapered geometry, arranged as shown in FIG. 6B, produces a resistor that has its highest incremental resistance at its base and its lowest incremental resistance at its apex. Incremental resistance, as used herein, is a magnitude of resistance which would be measured on an essentially linear path from a point on the edge of an input port 603 of balancing resistor 601 to a point on the edge of an output port 605 of balancing resistor 601 without any parallel resistance effects from any other path across balancing resistor 601. When the path lengths for current flowing through the shorting bar segment 511*a*, the balancing resistor 601, and the shorting bar segment 511*b* are taken into consideration, the resistance encountered by an electric current flowing from the output port 513 of heater resistor segment 501 to the input port 509 of heater resistor segment 503 is essentially the same.

Figure 7:
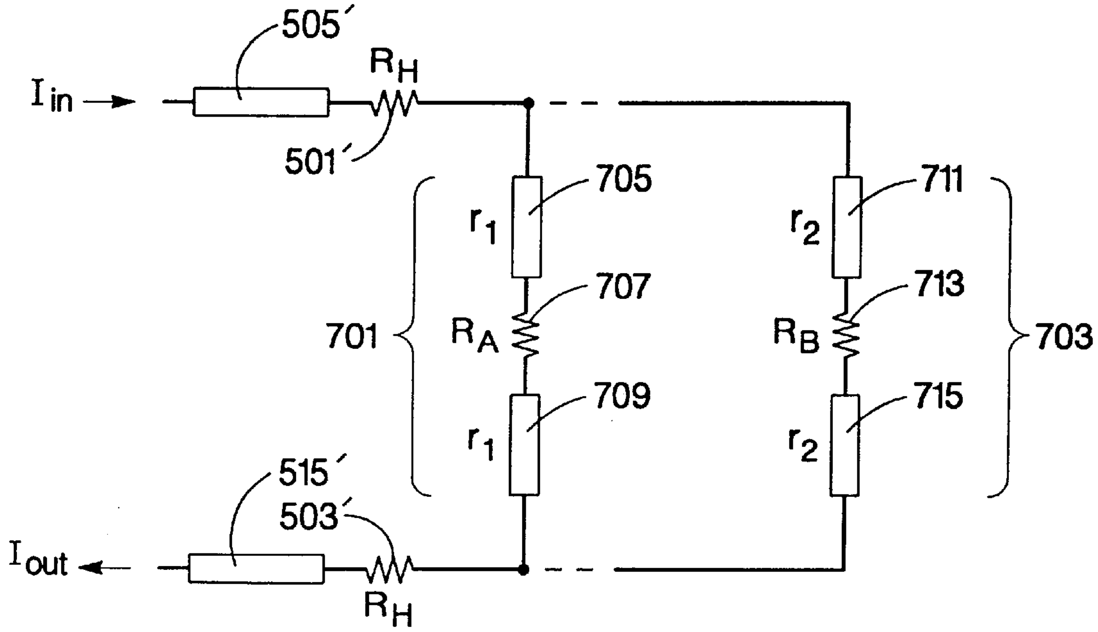
FIG. 7 is an electrical schematic diagram of the segmented heater resistor depicted in FIGS. 6B and 6C.
Figure 6C:
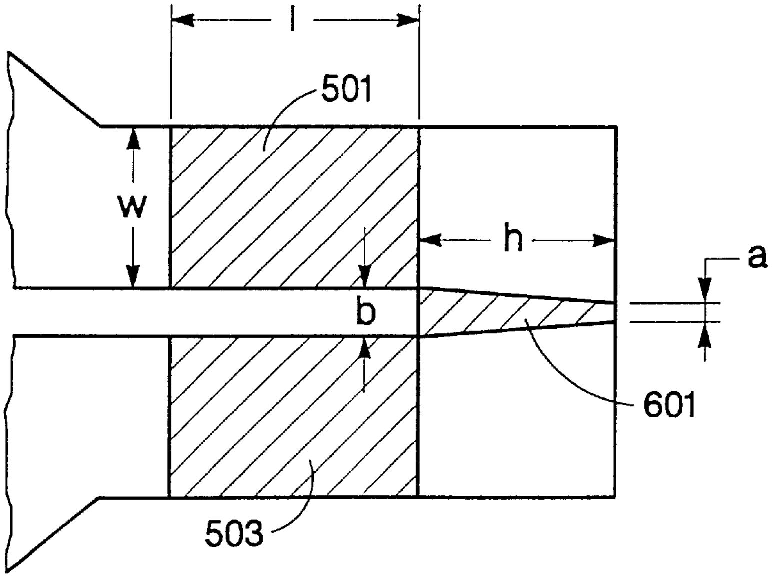

Stated another way and with reference to FIG. 7, a resistor model can be configured to help explain the operation of this facet of the present invention. Current flows into heater resistor segment 501' (having a resistance value of $R_H$) via conductor 505'. At the output of heater resistor segment 501', the current divides into a multiplicity of paths—two of which are deemed to be path 701 and path 703. In path 701, a component of the current flows through a physically short path 705 (having a parasitic resistance value of $r_1$) of shorting bar segment 511*a*, through a physically long path 707 (having a resistance value of $R_A$) of balancing resistor 601, and through another physically short path 709 (having a parasitic resistance value of $r_1$) of shorting bar segment 511*b*. In path 711, another component of the current flows through a physically long path (having a parasitic resistance value of $r_2$) of shorting bar segment 511*a*, through a physically short path 713 (having a resistance value of $R_B$) of balancing resistor 601, and through another physically long path (having a parasitic resistance value of $r_1$) of shorting bar segment 511*b*. The current recombines at the input to heater resistor segment 503' (having a resistance value of $R_H$) and is returned via conductor 515'. In order that the current be balanced and current crowding be avoided, the balancing resistor 601 and the shorting bar segments 511*a*, and 511*b* are designed so that:

$$r_1<r_2,$$

$$R_H>R_A>R_B, \text{ and}$$

$$R_A+2r_1=R_B+2r_2.$$

The component of the current flowing through path 701 is therefore made essentially equal to the component of current flowing through path 703 and current crowding is avoided.

The physical implementation of a preferred embodiment of the present invention uses a heater resistor having a total ($R_H+R_H$) resistance value of approximately 140 ohms. As diagrammed in a preferred embodiment illustrated in FIG. 6B, the balancing resistor has a total measurable resistance value of 4 ohms with physical dimensions of $b\cong2.3$ μm at the base, $a\cong1.8$ μm at the truncated apex, and a truncated triangle height of $h\cong25$ μm, which is related to the lengths of the triangle sides. The heater resistor segments 501 and 503 each have a width of $w\cong9$ μm and a length $l\cong20$ μm. The tantalum-aluminum thin film of the heater resistor segments and the balancing resistor has a thickness of approximately 900 Angstroms. It should be noted that as the height, h, becomes larger (that is, as the shorting bar becomes wider) the current distribution becomes greater (more individual electron paths are available) and the total measurable resistance value increases.

Figure 8:
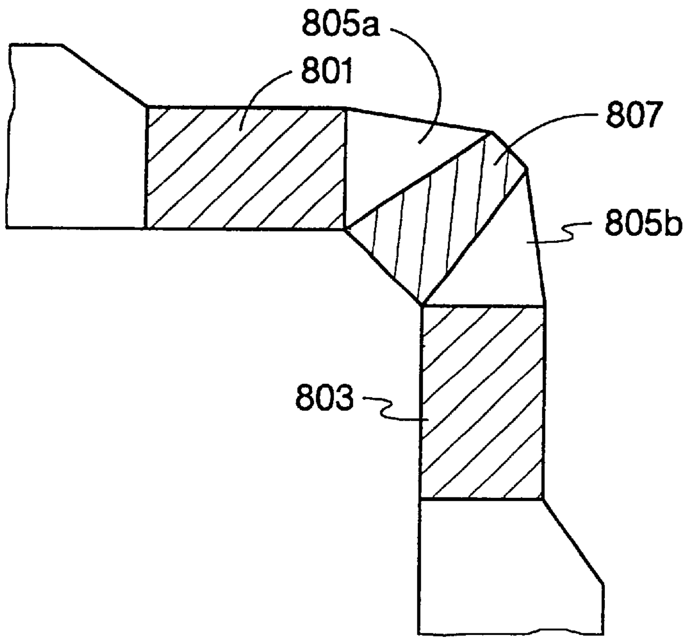
FIG. 8 is a plan view of an alternative embodiment of a segmented heater resistor, divided shorting bar, and balancing resistor.

In an alternative embodiment where the heater resistor need not be concentrated in a confined area (such as in a distributed or multiple coordinated nozzle configuration) but in which a turn or comer is necessary in the shorting bar portion, an application of the present invention may be employed to minimize the effects of current crowding in the shorting bar. A ninety degree turn is necessary in the shorting bar for the heater resistor configuration of FIG. 8. The heater resistor consists of two resistor segments 801, 803 joined by a shorting bar conductor separated into two portions 805*a* and 805*b* by balancing resistor 807.

Figure 9:
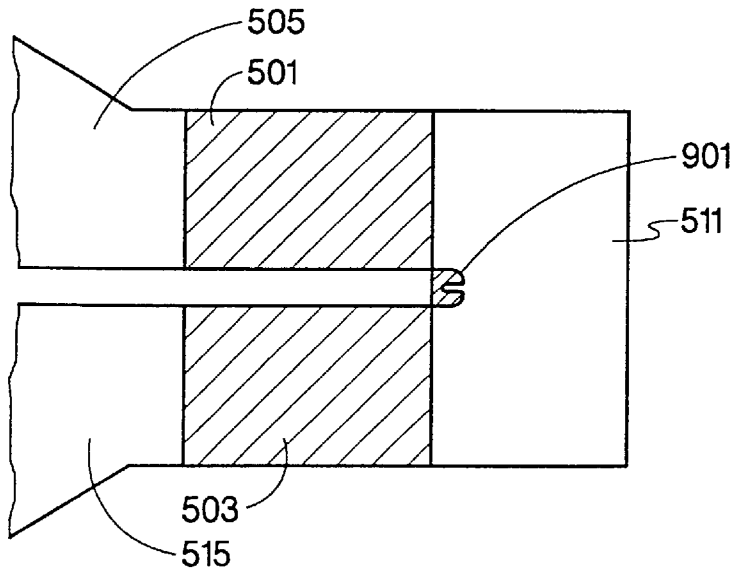
FIG. 9 is a plan view of an alternative embodiment of a segmented heater resistor and current control device.

Other ways of balancing the current in a coupling device using a current control device can be considered, as illustrated in FIG. 9. For example, the current control device 600 can be a missing or higher resistance portion 901 of coupling device 511 that is positioned in the region of current crowding. Portion 901 is depicted to be of any or geometry that reduces current crowding in coupling device 511 to an acceptable level. Alternatively, coupling device 511 may have a graded or varying resistance level that increases with distance from resistor segments 501 and 503 to minimize the maximum current density in coupling device 511. Stated another way, coupling device 511 can comprise a sheet 511 of varying sheet resistance wherein the sheet resistance has a higher value where coupling device contacts resistor segments 501 and 501. In that event, this variation of sheet resistance can be referred to as a current control device aspect of coupling device 511.

Thus, a thermal ink drop generator has been described which enables a higher value of resistance to be realized by improving the heater resistor geometry of segmented resistors. Current crowding is reduced by employing a balancing resistor as part of the shorting bar conductor.

We claim:

1. A method of manufacture of a printhead for an inkjet print cartridge comprising the steps of:

disposing a first resistor segment and a second resistor segment on a substrate;

electrically coupling said first resistor segment to said second resistor segment with a thin film conductor shorting bar, said shorting bar having a first shorting bar segment and a second shorting bar segment;

disposing on said substrate a connection edge of said first shorting bar segment with one end of said first shorting bar segment connection edge proximate said first resistor segment and the other end of said first shorting bar segment connection edge distal said first resistor segment;

disposing on said substrate a connection edge of said second shorting bar segment with one end of said second shorting bar segment connection edge proximate said second resistor segment and the other end of said second shorting bar segment connection edge distal said second resistor segment; and resistively coupling said first shorting bar segment to said second shorting bar segment with a resistance having a magnitude between said proximate first shorting bar conductor segment connection edge and said proximate second shorting bar segment connection edge that is greater than that between said distal first shorting bar conductor segment connection edge and said distal second shorting bar segment connection edge.

2. A method in accordance with the method of claim 1 wherein said step of disposing said first resistor segment and a second resistor segment further comprises the steps of providing a first resistor segment input port and a first resistor segment output port and providing a second resistor segment input port and a second resistor segment output port on said substrate.

3. A method in accordance with the method of claim 2 wherein said step of electrically coupling further comprises the steps of coupling said first shorting bar segment to said first resistor segment output port and coupling said second shorting bar segment to said second resistor segment input port.

4. A method in accordance with the method of claim 3 wherein said step of disposing said first heater resistor segment and said second heater resistor segment further comprises the step of disposing said first heater resistor segment adjacent said second heater resistor segment.

5. A method in accordance with the method of claim 4 wherein said step of disposing a first resistor segment and a second resistor segment further comprises the steps of disposing an input port of said first heater resistor segment adjacent said output port of said second heater resistor segment and disposing said output port of said first heater resistor segment adjacent said input port of said second heater resistor segment.

6. A method in accordance with the method of claim 5 wherein:

said step of providing a first resistor segment input port and a first resistor segment output port further comprises the steps of disposing said first resistor segment input port as an essentially straight edge and disposing said first resistor output port as an essentially straight edge;

said step of providing a second resistor segment input port and a second resistor segment output port further comprises the steps of disposing said second resistor segment input port as an essentially straight edge and disposing said second resistor output port as an essentially straight edge; and further comprising the steps of disposing said first resistor segment input port edge essentially collinear with said second resistor segment output port edge and disposing said first resistor segment output port edge essentially collinear with said second resistor segment input port edge.

7. A method in accordance with claim 1 wherein said step of resistively coupling further comprises the step of disposing on said substrate a balancing resistor between said first shorting bar segment connection edge and said second shorting bar segment connection edge.

8. A method in accordance with the method of claim 7 wherein said step of disposing a balancing resistor on said substrate further comprises the steps of:

disposing said balancing resistor as a truncated triangle geometric shape;

disposing the base of said truncated triangle geometric shape proximate said first resistor segment; and disposing the apex of said truncated triangle geometric shape distal said first resistor segment.

9. A method in accordance with the method of claim 8 wherein said step of disposing a balancing resistor on said substrate further comprises the steps of:

contacting a first side of said truncated triangle geometric shaped balancing resistor with said first shorting bar segment connection edge; and contacting a second side of said truncated triangle geometric shaped balancing resistor with said second shorting bar segment connection edge.

10. A method in accordance with the method of claim 7 wherein said step of disposing a balancing resistor on said substrate further comprises the steps of:

disposing said balancing resistor as a truncated triangle geometric shape;

disposing the base of said truncated triangle geometric shape proximate said second resistor segment; and disposing the apex of said truncated triangle geometric shape distal said second resistor segment.

11. A method of manufacture of a printhead for an inkjet print cartridge comprising the steps of:

disposing a discontinuous thin film resistive layer on a substrate; and disposing a discontinuous thin film conductive layer on a substrate, wherein said resistive layer disposition step and said conductive layer disposition step further comprise the steps of:

disposing a first resistor segment and a second resistor segment on a substrate;

electrically coupling said first resistor segment to said second resistor segment with a thin film conductor shorting bar, said shorting bar having a first shorting bar segment and a second shorting bar segment;

disposing on said substrate a connection edge of said first shorting bar segment with on end of said first shorting bar segment connection edge proximate said first resistor segment and the other end of said first shorting bar segment connection edge distal said first resistor segment;

disposing on said substrate a connection edge of said second shorting bar segment with one end of said second shorting bar segment connection edge proximate said second resistor segment and the other end of said second shorting bar segment connection edge distal said second resistor segment; and resistively coupling said first shorting bar segment to said second shorting bar segment with a resistance having a magnitude between said proximate first shorting bar conductor segment connection edge and said proximate second shorting bar segment connection edge that is greater than that between said distal first shorting bar conductor segment connection edge and said distal second shorting bar segment connection edge.

* * * * *